(12) United States Patent
Park et al.

(10) Patent No.: US 11,723,241 B2
(45) Date of Patent: Aug. 8, 2023

(54) DISPLAY DEVICE WITH REDUCED PARASITIC CAPACITANCES BETWEEN PIXEL ELECTRODES AND DATA LINES

(71) Applicant: Samsung Display Co., Ltd., Yongin-Si (KR)

(72) Inventors: Jun Hyun Park, Suwon-si (KR); Dong Woo Kim, Yongin-si (KR); Sung Jae Moon, Seongnam-si (KR); Kang Moon Jo, Hwaseong-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 399 days.

(21) Appl. No.: 16/869,673

(22) Filed: May 8, 2020

(65) Prior Publication Data
US 2020/0381507 A1 Dec. 3, 2020

(30) Foreign Application Priority Data

Jun. 3, 2019 (KR) ........................ 10-2019-0065232

(51) Int. Cl.
| | |
|---|---|
| *H10K 59/131* | (2023.01) |
| *H01L 49/02* | (2006.01) |
| *H10K 59/35* | (2023.01) |
| *H10K 59/123* | (2023.01) |
| *H10K 59/121* | (2023.01) |

(52) U.S. Cl.
CPC ........... *H10K 59/131* (2023.02); *H01L 28/60* (2013.01); *H10K 59/123* (2023.02); *H10K 59/1216* (2023.02); *H10K 59/35* (2023.02)

(58) Field of Classification Search
CPC ............. H01L 27/3276; H01L 27/3211; H01L 27/3248; H01L 27/3265; H01L 28/60
USPC .......................................................... 257/40
See application file for complete search history.

(56) References Cited

U.S. PATENT DOCUMENTS

| | | | |
|---|---|---|---|
| 2017/0193876 A1* | 7/2017 | Choi | ..................... H01L 27/326 |
| 2018/0024392 A1 | 1/2018 | Park et al. | |
| 2018/0040682 A1 | 2/2018 | Ebisuno et al. | |
| 2020/0118477 A1 | 4/2020 | Choi et al. | |

FOREIGN PATENT DOCUMENTS

| | | | |
|---|---|---|---|
| EP | 3193322 A1 | 7/2017 | |
| EP | 3282482 A1 | 2/2018 | |
| JP | 2017-173505 A | 9/2017 | |
| KR | 10-2016-0053043 A | 5/2016 | |
| KR | 10-2018-0057764 A | 5/2018 | |
| KR | 10-2018-0062289 A | 6/2018 | |

* cited by examiner

*Primary Examiner* — Xia L Cross
(74) *Attorney, Agent, or Firm* — Innovation Counsel LLP

(57) ABSTRACT

The present disclosure relates to a display device, and the display device according to an exemplary embodiment of the present inventive concept includes: a first pixel circuit portion including at least one transistor; a second pixel circuit portion including at least one transistor; a first pixel electrode electrically connected to the first pixel circuit portion; a second pixel electrode electrically connected to the second pixel circuit portion; a first data line electrically connected to the first pixel circuit portion; and a second data line electrically connected to the second pixel circuit portion, wherein the first data line and the second data line are arranged adjacent to each other along a first direction, and the second pixel electrode overlaps the first data line and the second data line in a plan view.

13 Claims, 10 Drawing Sheets

DISPLAY DEVICE WITH REDUCED PARASITIC CAPACITANCES BETWEEN PIXEL ELECTRODES AND DATA LINES

CROSS-REFERENCE TO RELATED APPLICATION

This application claims priority to and the benefit of Korean Patent Application No. 10-2019-0065232 filed in the Korean Intellectual Property Office on Jun. 3, 2019, the entire contents of which are incorporated herein by reference.

BACKGROUND

(a) Technical Field

The present disclosure relates to a display device.

(b) Description of the Related Art

A display device is an apparatus for displaying an image and a light emitting diode display has been attracting attention as a self-emitting display device recently.

Unlike a liquid crystal display (LCD) device, the light emitting diode display has a self-emission characteristic which eliminates the necessity for a separate light source, and thus can be fabricated to be thinner and lighter. Further, the light emitting diode display has high quality characteristics such as low power consumption, high luminance, high response speed, and the like.

In general, the light emitting diode display includes a plurality of pixels, and each pixel includes a plurality of transistors and a light-emitting element. Each of the plurality of transistors is connected to a respective signal line and may deliver a driving current to a respective light-emitting element. A transistor may include an active pattern that includes a channel region and a conductive region.

The light-emitting element may include an anode and a cathode, and the anode may be connected to the transistor of the pixel to receive a driving current.

The above information disclosed in this Background section is only for enhancement of understanding of the background of the inventive concept and therefore it may contain information that does not form the prior art that is already known in this country to a person of ordinary skill in the art.

SUMMARY

This disclosure is to increase a display quality by reducing a capacitance of a parasitic capacitor between the pixel electrode and the data line of a plurality of pixels of the display device, or by reducing the deviation.

A display device according to an exemplary embodiment of the present inventive concept includes: a first pixel circuit portion including at least one transistor; a second pixel circuit portion including at least one transistor; a first pixel electrode electrically connected to the first pixel circuit portion; a second pixel electrode electrically connected to the second pixel circuit portion; a first data line electrically connected to the first pixel circuit portion; and a second data line electrically connected to the second pixel circuit portion, wherein the first data line and the second data line are arranged adjacent to each other along a first direction, and the second pixel electrode overlaps the first data line and the second data line in a plan view.

The first pixel circuit portion and the second pixel circuit portion may be arranged along a second direction perpendicular to the first direction.

The first pixel electrode and the second pixel electrode may be arranged along the first direction.

The first pixel electrode and the second pixel electrode may be arranged along the second direction.

The second pixel electrode may overlap at least a part of the first data line and the second data line, and the first pixel electrode does not overlap the first data line and the second data line.

A first capacitor electrode in the first pixel circuit portion and a second capacitor electrode in the second pixel circuit portion disposed in a same conductive layer as the first data line and the second data line may be further included, the first pixel electrode may be electrically connected to the first transistor via the first capacitor electrode, the second pixel electrode may be electrically connected to the second transistor via the second capacitor electrode, and the first data line and the second data line may be disposed at a same side of the first capacitor and the second capacitor.

A third pixel circuit portion including at least one transistor, and a third pixel electrode electrically connected to the third pixel circuit portion may be further included, and in a plan view, the third pixel circuit portion is arranged along the second direction with the first pixel circuit portion and the second pixel circuit portion, and the third pixel electrode is arranged along the first direction with the first pixel electrode and the second pixel electrode.

The second pixel electrode may overlap at least a part of the first data line and the second data line, and has a smallest area among the first pixel electrode, the second pixel electrode, and the third pixel electrode.

The second pixel electrode may be a blue pixel electrode.

The second pixel electrode may have a largest area among the first pixel electrode, the second pixel electrode and third pixel electrode.

The second pixel electrode may be a red pixel electrode.

The second pixel electrode may overlap with the first data line, the second data line and third data line.

A display device according to an exemplary embodiment of the present inventive concept includes a first pixel circuit portion including: a first transistor; a second pixel circuit portion including a second transistor; a first data line electrically connected to the first pixel circuit portion; a second data line electrically connected to the second pixel circuit portion; a first pixel electrode electrically connected to the first pixel circuit portion; a second pixel electrode electrically connected to the second pixel circuit portion; an emission layer disposed on the first pixel electrode and the second pixel electrode; and a common electrode disposed on the emission layer, wherein, in a plan view, the first pixel circuit portion and the second pixel circuit portion are arranged along a first direction, and the first pixel electrode and the second pixel electrode are arranged along the first direction, the first data line and the second data line are arranged adjacent to each other along a second direction different from the first direction, and the pixel electrode and the second pixel electrode respectively overlap at least one of the first data line and the second data line in a plan view.

An area of the first pixel electrode may be different from an area of the second pixel electrode.

A first capacitor electrode in the first pixel circuit portion and a second capacitor electrode in the second pixel circuit portion disposed in a same conductive layer as the first data line and the second data line may be further included, the first pixel electrode may be electrically connected to the first transistor via the first capacitor electrode, and the second pixel electrode may be electrically connected to the second transistor via the second capacitor electrode.

A first gate electrode included in the first transistor and a second gate electrode included in the second transistor may be further included, the first gate electrode may form a first capacitor along with the first capacitor electrode, the second gate electrode may form a second capacitor along with the second capacitor electrode, the first capacitor and the second capacitor may be arranged along the first direction, and in a plan view, the first data line and the second data line may be disposed at a same side of the first capacitor and the second capacitor.

A third pixel circuit portion including a third transistor and a third pixel electrode electrically connected to the third pixel circuit portion may be further included, the third pixel circuit portion may be arranged along the first direction with the first circuit portions and the second pixel circuit portion, the third pixel electrode may be arranged along the first direction with the first pixel electrode and the second pixel electrode, and the third pixel electrode may overlap at least one of the first data line and the second data line.

A display device according to an exemplary embodiment of the present inventive concept includes: a plurality of pixel circuit portions arranged along a first direction; a plurality of data lines arranged along a second direction different from the first direction and adjacent to each other; a plurality of pixel electrodes electrically connected to the plurality of pixel circuit portions, respectively; an emission layer disposed on the plurality of pixel electrodes; and a common electrode disposed on the emission layer, wherein the plurality of data lines are disposed at one side of the plurality of pixel circuit portions, and at least one pixel electrode among the plurality of pixel electrodes overlaps at least one data line among the plurality of data lines in a plan view.

The plurality of pixel electrodes may be arranged along the second direction, and the at least one pixel electrode overlaps the plurality of data lines in a plan view.

The at least one pixel electrode may completely overlap the plurality of data lines in a plan view.

According to exemplary embodiments of the present disclosure, a capacitance of a parasitic capacitor between the pixel electrode and the data line of the plurality of pixels of the display device may be reduced or a deviation may be reduced, thereby improving display quality.

DETAILED DESCRIPTION OF THE EMBODIMENTS

Figure 1:
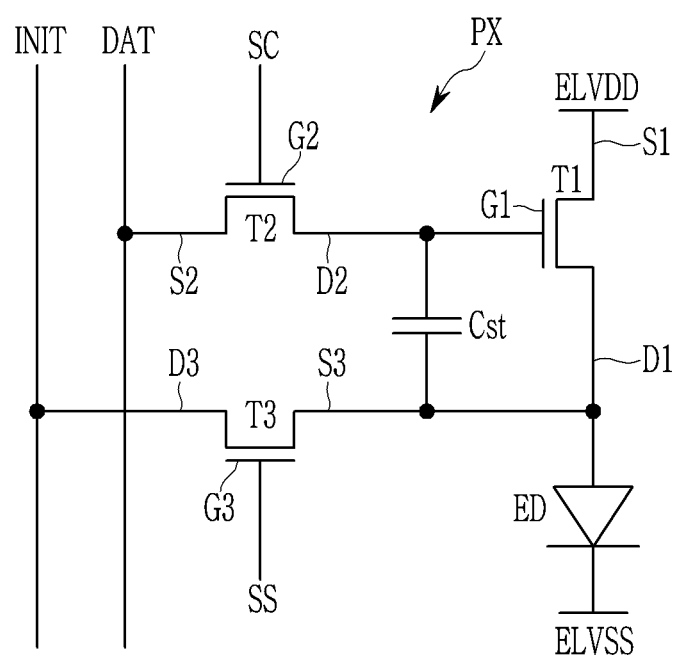
FIG. 1 is a circuit diagram of one pixel of a display device according to an exemplary embodiment of the present inventive concept.

In the following detailed description, only certain exemplary embodiments of the present inventive concept have been shown and described, simply by way of illustration. As those skilled in the art would realize, the described embodiments may be modified in various different ways, all without departing from the spirit or scope of the present inventive concept.

In the drawings and this specification, parts or elements that are not related to the description hereof are omitted in order to clearly describe the present inventive concept, and the same or like constituent elements are designated by the same reference numerals throughout the specification.

In addition, the size and thickness of each component shown in the drawings are arbitrarily shown for better understanding and ease of description, but the present inventive concept is not limited thereto. In the drawings, the thickness of layers, films, panels, regions, etc., are exaggerated for clarity. In the drawings, for better understanding and ease of description, the thickness of some layers and areas is exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

Throughout this specification and the claims which follow, a plan view means a view when observing a surface parallel to two directions (e.g., a direction DR1 and a direction DR2) crossing each other, and a cross-sectional view means a view when observing a surface cut in a direction (e.g., a direction DR3) perpendicular to the surface parallel to the direction DR1 and the direction DR2. Also, to overlap two constituent elements means that two constituent elements are overlapped in the direction DR3 (e.g., a direction perpendicular to an upper surface of the substrate) unless stated otherwise.

First, a structure of a display device according to an exemplary embodiment of the present inventive concept is described with reference to FIG. 1.

FIG. 1 is a circuit diagram of one pixel PX of a display device according to an exemplary embodiment of the present inventive concept.

The display device according to an exemplary embodiment of the present inventive concept includes a plurality of pixels PX and each of the plurality of pixels PX may include a pixel circuit including a plurality of transistors T1, T2, and T3 and a capacitor Cst, and at least one light emitting diode (LED) as a light-emitting element connected to the pixel circuit. In the present exemplary embodiment, one pixel PX includes one light emitting diode (LED) ED.

The plurality of transistors T1, T2, and T3 include a first transistor T1, a second transistor T2, and a third transistor T3. The source and drain electrodes are electrodes disposed on respective sides of a channel of each transistor T1, T2, and T3, and the terms may be interchanged.

A gate electrode G1 of the first transistor T1 is connected to one terminal of the capacitor Cst, a source electrode S1 of the first transistor T1 is connected to a driving voltage line transmitting a driving voltage ELVDD, and a drain electrode D1 of the first transistor T1 is connected to an anode of the light emitting diode (LED) ED and the other terminal of the capacitor Cst. The first transistor T1 receives the data voltage DAT in response to the switching operation of the second transistor T2, and may supply the driving current to the light emitting diode (LED) ED according to the voltage stored in the capacitor Cst.

A gate electrode G2 of the second transistor T2 is connected to a first scan line transmitting a first scan signal SC, a source electrode S2 of the second transistor T2 is connected to a data line capable of transmitting a data voltage DAT or a reference voltage, and a drain electrode D2 of the second transistor T2 is connected to one terminal of the capacitor Cst and the gate electrode G1 of the first transistor T1. The second transistor T2 may be turned on in response to the first scan signal SC to transmit the reference voltage or data voltage DAT to the gate electrode G1 of the first transistor T1 and one terminal of the capacitor Cst.

A gate electrode G3 of the third transistor T3 is connected to the second scan line which transmits a second scan signal SS, a source electrode S3 of the third transistor T3 is connected to the other terminal of the capacitor Cst, the drain electrode D1 of the first transistor T1, and the anode of the light emitting diode (LED) ED, and a drain electrode D3 of the third transistor T3 is connected to an initializing voltage line transmitting an initialization voltage INIT. The third transistor T3 is turned on in response to the second scan signal SS to transmit the initialization voltage INIT to the other terminal of the capacitor Cst and the anode of the light emitting diode (LED) ED such that the voltage of the anode of the light emitting diode (LED) ED be initialized.

One terminal of the capacitor Cst is connected to the gate electrode G1 of the first transistor T1, and the other terminal is connected to the source electrode S3 of the third transistor T3 and the anode of the light emitting diode (LED) ED. The cathode of the light emitting diode (LED) ED is connected to a common voltage line that transmits the common voltage ELVSS.

The light emitting diode (LED) ED may emit light of luminance according to the driving current generated by the first transistor T1.

An example of the operation of the circuit shown in FIG. 1, particularly an example of the operation during one frame, is described. In this example, the transistors T1, T2, and T3 are N-type channel transistors, but the types of the transistors T1, T2, and T3 are not limited thereto.

When one frame starts, the second scan signal SS of the high level and the first scan signal SC of the high level are supplied in an initialization period, and the second transistor T2 and the third transistor T3 are turned on. The reference voltage from the data line is supplied to the gate electrode G1 of the first transistor T1 and one terminal of the capacitor Cst via the turned-on second transistor T2, and the initialization voltage INIT is supplied to the drain electrode D1 of the first transistor T1 and the anode of the light emitting diode (LED) ED via the turned-on third transistor T3. Accordingly, the drain electrode D1 of the first transistor T1 and the anode of the light emitting diode (LED) ED are initialized with the initialization voltage INIT during the initialization period. During the initialization period, the capacitor Cst stores a voltage difference between the reference voltage and the initialization voltage INIT.

Then, in a sensing period, the second scan signal SS falls to a low level to turn off the third transistor T3 while maintaining the first scan signal SC to a high level to maintain the turn-on state of the first transistor T1. The gate electrode G1 of the first transistor T1 and one terminal of the capacitor Cst maintain the reference voltage via the turned-on second transistor T2, and the drain electrode D1 of the first transistor T1 and the anode of the light emitting diode (LED) ED are disconnected from the initialization voltage INIT via the turned-off third transistor T3. Thus, the first transistor T1 is turned on and current flows from the source electrode S1 to the drain electrode until the voltage of the drain electrode D1 becomes \"reference voltage−Vth\", where Vth represents the threshold voltage of the first transistor T1. During the sensing period, the voltage difference between the gate electrode G1 and the drain electrode D1 of the first transistor T1 is stored in the capacitor Cst, and the sensing of the threshold voltage (Vth) of the first transistor T1 is completed. Because compensated data signal is supplied to the gate of the first transistor T1, the characteristic deviation of the first transistor T1, which may vary from pixel to pixel, may be externally compensated.

Next, in a data input period, the first scan signal SC of the high level is supplied to the second transistor T2 to turn on the second transistor T2 and the second scan signal SS of the low level is supplied to the third transistor T3 to turn off the third transistor. The data voltage DAT from the data line is supplied to the one terminal of the capacitor Cst and the gate electrode G1 of the first transistor T1 via the second transistor T2 which is turned on. During the data input period, the anode of the light emitting diode (LED) ED and the drain electrode D1 of the first transistor T1 may substantially maintain the potential as it is in the sensing period because the first transistor T1 is in the turned-off state.

Next, in a light emitting period, the first transistor T1 that is turned on by the data voltage DAT transmitted to the gate electrode G1 generates a driving current according to the data voltage DAT, and the light emitting diode (LED) ED emits light according to the driving current.

A detailed structure of the display device according to an exemplary embodiment of the present inventive concept is described with reference to FIG. 2 to FIG. 4 as well as FIG. 1.

Figure 2:
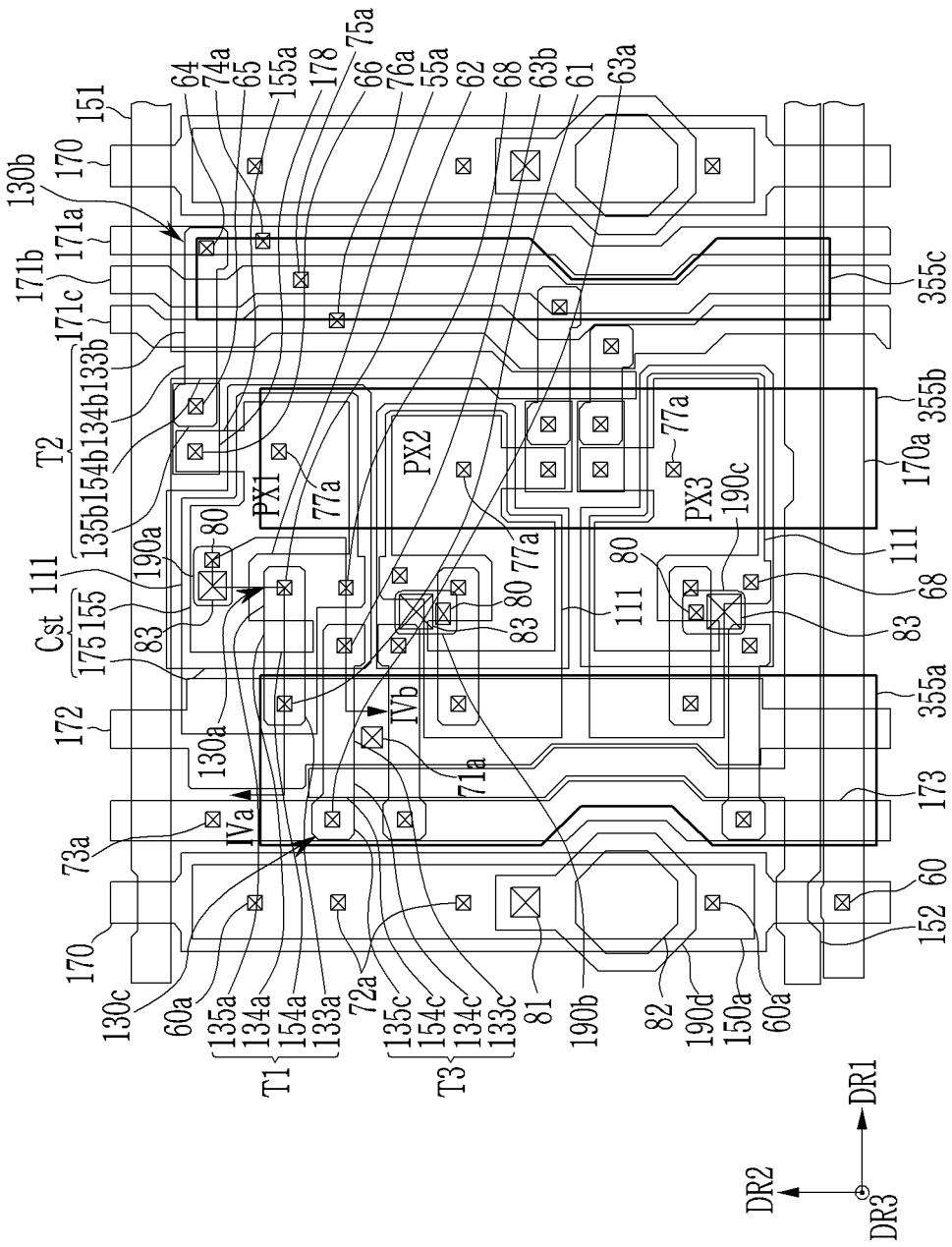
FIG. 2 is a plan layout view of a plurality of pixels of a display device according to an exemplary embodiment of the present inventive concept.
Figure 3:
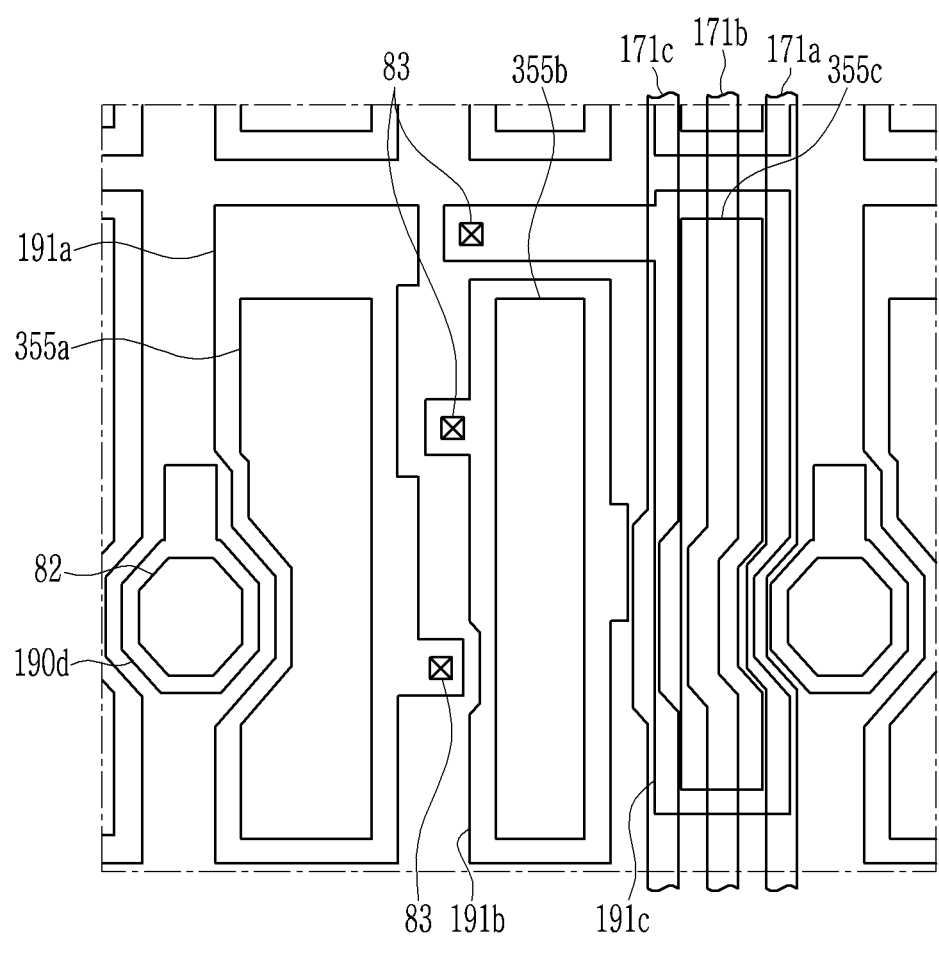
FIG. 3 is a plan layout view of a pixel electrode layer and a plurality of data lines of a display device according to an exemplary embodiment of the present inventive concept.
Figure 4:
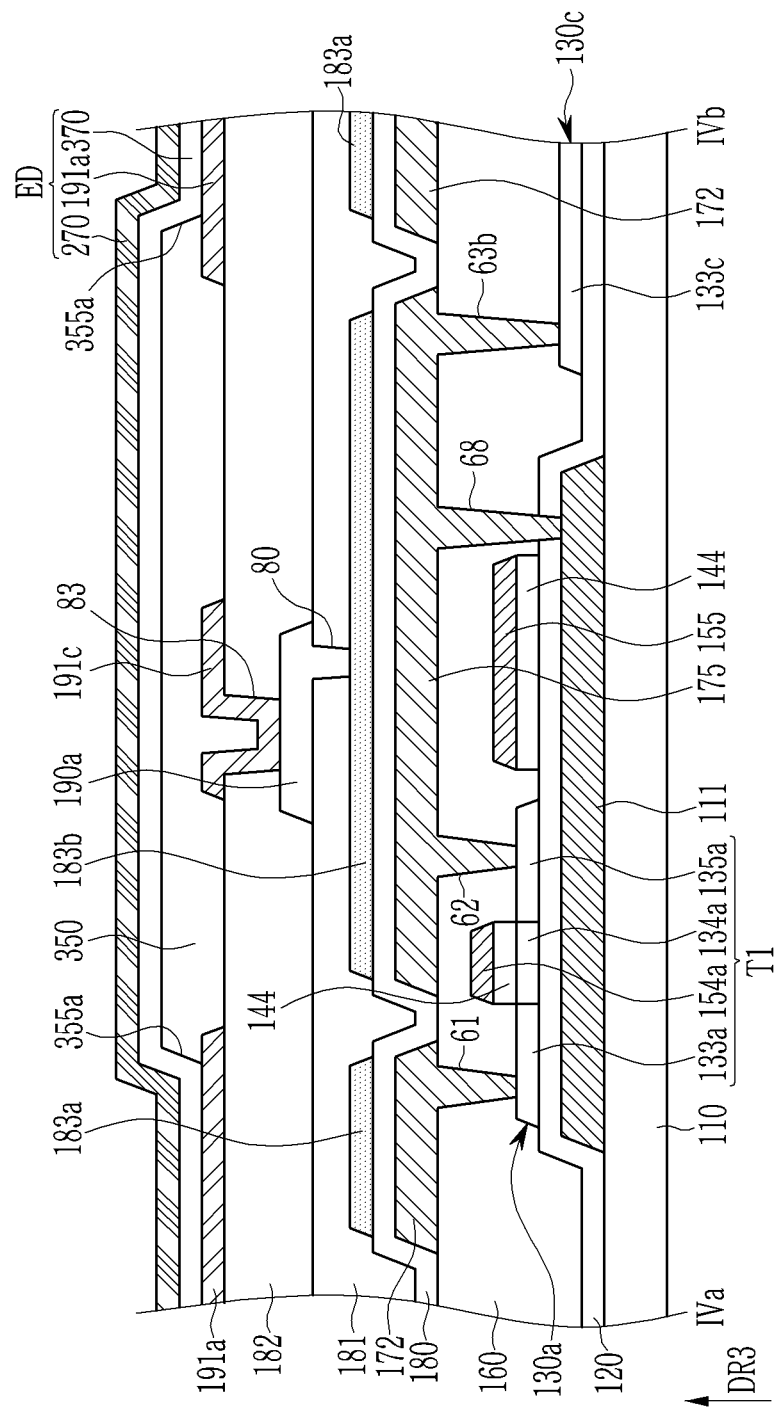
FIG. 4 is a cross-sectional view of the display device shown in FIG. 2 taken along a line IVa-IVb.

FIG. 2 is a plan layout view of a plurality of pixels of a display device according to an exemplary embodiment of the present inventive concept, FIG. 3 is a plan layout view of a pixel electrode layer and a plurality of data lines of a display device according to an exemplary embodiment of the present inventive concept, and FIG. 4 is a cross-sectional view of the display device shown in FIG. 2 taken along a line IVa-IVb, Here, each of the plurality of pixel circuit portions PX1, PX2, and PX3 may be a portion or region in which the plurality of transistors T1, T2, and T3 and the capacitor Cst are formed among the constituent elements included in one pixel PX described above.

The display device according to an exemplary embodiment may include a substrate 110. The substrate 110 may include an insulating material such as glass, plastic, or the like, and may have flexibility.

A first conductive layer including a lower pattern 111 and a transverse common voltage line 170a may be disposed on the substrate 110. Each lower pattern 111 may be disposed at each pixel circuit portions PX1, PX2, and PX3 to overlap the pixel circuit portions PX1, PX2, and PX3. The transverse common voltage line 170a may extend approximately in the first direction DR1. The lower pattern 111 may include various conductive metals or semiconductor materials having conductive characteristics.

A buffer layer 120, which is an insulating layer, may be disposed on the first conductive layer.

An active layer including a plurality of active patterns 130a, 130b, and 130c may be disposed on the buffer layer 120. The active patterns 130a, 130b, and 130c disposed in each of the pixel circuit portions PX1, PX2, and PX3 may include channel regions 134a, 134b, and 134c for forming each channel of the plurality of transistor T1, T2, and T3, and conductive regions connected thereto. The conductive region of each of the active patterns 130a, 130b, and 130c may include source regions 133a, 133b, and 133c and drain regions 135a, 135b, and 135c of each transistor T1, T2, and T3.

The plurality of active patterns 130a, 130b, and 130c disposed in the pixel circuit portions PX1, PX2, and PX3 may be separated from each other, but the configuration of the plurality of active patterns 130a, 130b, and 130c are not limited thereto. For example, the active pattern 130a and the active pattern 130c may be connected to each other. FIG. 2 shows an example in which the active pattern 130a and the active pattern 130c are separated from each other.

The active layer may include a semiconductor material such as amorphous silicon, polysilicon, an oxide semiconductor, and the like.

An insulating pattern 144 of a first insulating layer may be disposed on the active layer. The insulating pattern 144 overlaps the channel regions 134a, 134b, and 134c of the active patterns 130a, 130b, and 130c, and may be disposed above the channel regions 134a, 134b, and 134c. The insulating pattern 144 may not substantially overlap the conductive regions of the active patterns 130a, 130b, and 130c.

A second conductive layer may be disposed on the insulating pattern 144.

The second conductive layer may include the first scan line 151 capable of transmitting the first scan signal SC above-described, the second scan line 152 capable of transmitting the second scan signal SS, a driving gate electrode 155, a second gate electrode 154b, and a third gate electrode 154c. The gate electrode G1, the gate electrode G2, and the gate electrode G3 in the above-described circuit diagram may correspond to the first gate electrode 154a, the second gate electrode 154b, and the third gate electrode 154c included in the driving gate electrode 155, respectively. The driving gate electrode 155 may be referred to as the first gate electrode.

First and second scan lines 151 and 152, respectively, may extend to the first direction DR1. The first scan line 151 and the second scan line 152 may be disposed above and below one group of the plurality of pixel circuit portions which includes pixel circuit portions PX1, PX2, and PX3.

Each driving gate electrode 155 may be positioned corresponding to each pixel circuit portion PX1, PX2, and PX3. The driving gate electrode 155 disposed at each pixel circuit portion PX1, PX2, and PX3 may include the first gate electrode 154a of a shape protruding above or below, and a protruded portion 155a protruding below or above. The first gate electrode 154a intersects the active pattern 130a and overlaps the channel region 134a of the active pattern 130a.

The plurality of second gate electrodes 154b corresponding to the plurality of pixel circuit portions PX1, PX2, and PX3 may be connected to each other and formed to extend in the second direction DR2 as a whole, and are connected to the first scan line 151. The second gate electrode 154b intersects the active pattern 130b of each pixel circuit portion PX1, PX2, and PX3, and overlaps the channel region 134b of the active pattern 130b.

The plurality of third gate electrodes 154c corresponding to the plurality of pixel circuit portions PX1, PX2, and PX3 may be connected to each other and formed to extend as a whole in the second direction DR2, and are connected to the second scan line 152. The third gate electrode 154c intersects the active pattern 130c of each of the pixel circuit portions PX1, PX2, and PX3 and overlaps the channel region 134c of the active pattern 130c.

The second conductive layer may further include a conductive pattern 150a overlapping a common voltage line 170, which will be described later.

A second insulating layer 160 may be disposed above the second conductive layer. The buffer layer 120 and/or the second insulating layer 160 may include a plurality of contact holes 60, 61, 62, 63a, 63b, 64, 65, 66, and 68.

A third conductive layer may be disposed on the second insulating layer 160. The third conductive layer, based on the plurality of pixel circuit portions PX1, PX2, and PX3 of one group, may include a plurality of data lines 171a, 171b, and 171c, a driving voltage line 172, a common voltage line 170, an initialization voltage line 173, a capacitor electrode 175, and a plurality of connecting members 178.

The common voltage line 170 may be electrically connected to the transverse common voltage line 170a through the contact hole 60 of the second insulating layer 160. The conductive pattern 150a of the second conductive layer may be electrically connected to the common voltage line 170 through a contact hole 60a of the second insulating layer 160 to provide an additional conductive path to reduce the resistance of the common voltage line 170. The conductive pattern 150a may be omitted.

The driving voltage line 172 is electrically connected to the source region 133a of the active pattern 130a through the contact hole 61 of the second insulating layer 160.

The initialization voltage line 173 is electrically connected to the drain region 135c of the active pattern 130c through the contact hole 63a of the second insulating layer 160.

The plurality of data lines 171a, 171b, and 171c may be arranged on a first side of the pixel circuit portions PX1, PX2 and PX3 and disposed adjacent to each other in the first direction DR1. There may be no third conductive layers between a plurality of data lines 171a, 171b, and 171c. Each data line 171a, 171b, and 171c is electrically connected to the source region 133b of the active pattern 130b through the contact hole 64 of the second insulating layer 160. Each data line 171a, 171b, and 171c may be bent by at least once as shown in FIG. 2 and FIG. 3.

Each pixel circuit portions PX1, PX2, and PX3 may have an island-shaped capacitor electrode 175. The capacitor electrode 175 may be disposed between the driving voltage line 172 and the data lines 171a, 171b, and 171c in a plan view. The capacitor electrode 175 may overlap the corresponding driving gate electrode 155 with the second insulating layer 160 disposed between the driving gate electrode 155 and the capacitor electrode 175 to form the capacitor Cst. The driving gate electrode 155 is the first capacitor electrode and the capacitor electrode 175 is the second capacitor electrode.

The capacitor electrode 175 is electrically connected to the drain region 135a of the active pattern 130a through the contact hole 62 of the second insulating layer 160 and electrically connected to the source region 133c of the active pattern 130c through the contact hole 63b of the second insulating layer 160. Also, the capacitor electrode 175 is electrically connected to the lower pattern 111 through the contact hole 68 of the second insulating layer 160 and the buffer layer 120. For contact between the capacitor electrode 175 and the drain region 135a of the active pattern 130a, the driving gate electrode 155 may include an opening 55a overlapping the contact hole 62 so that the driving gate electrode 155 may have a shape surrounding the periphery the contact hole 62, however it is not limited thereto.

The connecting member 178 is electrically connected to the drain region 135b of the active pattern 130b through the contact hole 65 in each of the pixel circuit portions PX1, PX2, and PX3 and electrically connected to the protruded part 155a of the driving gate electrode 155 through the contact hole 66, and as a result, the drain region 135b of the active pattern 130b and the protruded part 155a of the driving gate electrode 155 may be electrically connected to each other.

In a plan view, the data lines 171a, 171b, and 171c, the driving voltage line 172, the common voltage line 170, and the initialization voltage line 173 may respectively extend in the second direction DR2, thereby intersecting the first scan line 151 and the second scan line 152. The plurality of data lines 171a, 171b, and 171c, the driving voltage line 172, and the initialization voltage line 173 may be disposed between two neighboring common voltage lines 170.

The plurality of pixel circuit portions PX1, PX2, and PX3 of a group shown in FIG. 2 are arranged in the second direction DR2 and may be adjacent to each other, and may be repeatedly disposed in the first direction DR1 and the second direction DR2. Common voltage lines 170 may be respectively disposed at both the left and right sides of the plurality of pixel circuit portions PX1, PX2, and PX3 of a group, and the first scan line 151 and the second scan line 152 may be disposed at the upper and lower sides of the plurality of pixel circuit portions PX1, PX2, and PX3 of a group, respectively.

If the plurality of pixel circuit portions PX1, PX2, and PX3 of one repeating group contain three pixel circuit portions PX1, PX2, and PX3, three data lines 171a, 171b, and 171c, one driving voltage line 172, and one initialization voltage line 173 may be disposed between two neighboring common voltage lines 170.

At least one of the first conductive layer, the second conductive layer and the third conductive layer is made of at least one among metals such as copper (Cu), aluminum (Al), magnesium (Mg), silver (Ag), gold (Au), platinum (Pt), palladium (Pd), nickel (Ni), neodymium (Nd), iridium (Jr), molybdenum (Mo), tungsten (W), titanium (Ti), chromium (Cr), or tantalum (Ta), or alloys thereof. Each of the first conductive layer, the second conductive layer, and the third conductive layer may include a single layer or multiple layers. For example, the third conductive layer may have a multilayer structure including a lower layer including titanium and an upper layer including copper.

The first transistor T1 includes the channel region 134a, the source region 133a, the drain region 135a, and the first gate electrode 154a. The source region 133a of the first transistor T1 may be electrically connected to the driving voltage line 172, thereby receiving the driving voltage.

The lower pattern 111 corresponding to the first transistor T1 overlaps the channel region 134a between the channel region 134a of the first transistor T1 and the substrate 110 to prevent external light from reaching the channel region 134a, thereby reducing a leakage current and preventing characteristic deterioration of the first transistor T1. The lower pattern 111 is electrically connected to the drain region 135a of the first transistor T1 via the capacitor electrode 175.

The second transistor T2 includes the channel region 134b, the source region 133b, the drain region 135b, and the second gate electrode 154b. The source region 133b of the second transistor T2 of each of the pixel circuit portions PX1, PX2, and PX3 is electrically connected to the data lines 171a, 171b, and 171c, respectively, thereby receiving the data voltage or the reference voltage. The drain region 135b of the second transistor T2 may be electrically connected to the first gate electrode 154a via the driving gate electrode 155.

The third transistor T3 includes the channel region 134c, the source region 133c, and the drain region 135c, and the third gate electrode 154c. The drain region 135c of the third transistor T3 may receive the initialization voltage from the initialization voltage line 173.

A third insulating layer 180 may be disposed on the third conductive layer. The third insulating layer 180 may have a plurality of contact holes 71a, 72a, 73a, 74a, 75a, 76a, and 77a disposed on the third conductive layer.

A fourth conductive layer may be disposed on the third insulating layer 180. The fourth conductive layer may include a plurality of conductive patterns having the similar plan shape to that of the conductive pattern of the third conductive layer such as the data lines 171a, 171b, and 171c, the driving voltage line 172, the common voltage line 170, the initialization voltage line 173, and the capacitor electrode 175 disposed in the underlying third conductive layer and electrically connected to the conductive pattern of the corresponding third conductive layer.

For example, the data lines 171a, 171b, and 171c may be connected to the corresponding conductive pattern disposed in the fourth conductive layer through the contact holes 74a, 75a, and 76a, respectively, the driving voltage line 172 may be connected to a corresponding conductive pattern 183a disposed in the fourth conductive layer through the contact hole 71a, the common voltage line 170 may be connected to the corresponding conductive pattern disposed in the fourth conductive layer through the contact hole 72a, the initialization voltage line 173 may be connected to the corresponding conductive pattern disposed in the fourth conductive layer through the contact hole 73a, and the capacitor electrode 175 may be connected to a corresponding conductive pattern 183b disposed in the fourth conductive layer through the contact hole 77a.

The conductive patterns of the fourth conductive layer may reduce the resistance of the data lines 171a, 171b, and 171c, the driving voltage line 172, the common voltage line 170, the initialization voltage line 173 and the capacitor electrode 175 by forming an additional conductive path.

A fourth insulating layer 181 may be disposed on the fourth conductive layer. The fourth insulating layer 181 may include a contact hole 80 disposed on the conductive pattern 183*b* connected to the capacitor electrode 175 and a contact hole 81 disposed on the common voltage line 170.

A fifth conductive layer including a plurality of contact pads (contact members) 190*a*, 190*b*, 190*c*, and 190*d* may be disposed on the fourth insulating layer 181.

Each of the contact pads 190*a*, 190*b*, and 190*c* may be disposed at each of the pixel circuit portions PX1, PX2, and PX3, and may be in contact with and electrically connected to the corresponding conductive pattern 183*b* through the contact hole 80. Thus, each of the contact pads 190*a*, 190*b*, and 190*c* may be electrically connected to a conductive electrode 175 which is electrically connected to the conductive pattern 183*b*, respectively.

The contact pads 190*d* may be in contact with and electrically connected to the common voltage line 170 through the contact hole 81.

The contact pads 190*a*, 190*b*, 190*c*, and 190*d* may improve the adhesion between the conductive pattern of the fourth conductive layer and the other conductive layer in contact with each other and prevent oxidation of the fourth conductive layer.

Particularly, when the fourth conductive layer contains copper, the oxidation of copper may be prevented. For this purpose, the fifth conductive layer may include a conductive material that may prevent the corrosion of the fourth conductive layer, for example, if the fourth conductive layer includes copper, the conductive material may prevent the copper corrosion by capping the fourth conductive layer. For example, the fifth conductive layer may include a conductive material such as a metal oxide such as ITO or IZO.

A fifth insulating layer 182 may be disposed on the fifth conductive layer. The fifth insulating layer 182 may include a contact hole 83 disposed on each of the contact pads (contact members) 190*a*, 190*b*, and 190*c*.

In plan and section views, the center of the contact hole 83 may do not coincide with the center of the contact hole 80. The contact hole 83 and the contact hole 80 may not overlap each other in a plan view, or may be partially overlapped.

Both of the contact hole 83 and the contact hole 80 may overlap the corresponding contact pads (contact members) 190*a*, 190*b*, and 190*c* of each pixel circuit portion PX1, PX2, and PX3.

At least one of the buffer layer 120, the first insulating layer 144, the second insulating layer 160, the third insulating layer 180, the fourth insulating layer 181, and the fifth insulating layer 182 may include an inorganic insulating material such as a silicon nitride (SiNx), a silicon oxide (SiOx), a silicon oxynitride (SiON), and the like, and/or an organic insulating material. Particularly, the fifth insulating layer 182 may comprise an inorganic insulating material and/or an organic insulating material such as a polyimide, an acryl-based polymer, a siloxane-based polymer, or the like, and may have a substantially flat upper surface.

A pixel electrode layer including a plurality of pixel electrodes 191*a*, 191*b*, and 191*c* as a sixth conductive layer may be disposed on the fifth insulating layer 182.

Referring to FIG. 2 and FIG. 3, in a plan view, the plurality of pixel circuit portions PX1, PX2, and PX3 (or the first transistors T1 of the plurality of pixel circuit portions PX1, PX2, and PX3) of one repeated group are arranged in the second direction DR2, and the plurality of pixel electrodes 191*c*, 191*b*, and 191*a* respectively corresponding to the pixel circuit portion PX1, PX2, and PX3 may be adjacent to each other and arranged in the substantially first direction DR1. However, the arrangement and structure of the pixel circuit portions PX1, PX2, and PX3 and the corresponding pixel electrodes 191*c*, 191*b*, and 191*a* are not limited thereto. The plan size and shape of the pixel electrodes 191*a*, 191*b*, and 191*c* may differ from each other, but are not limited thereto.

The plurality of pixel electrodes 191*a*, 191*b*, and 191*c* may be electrically connected to the contact pads (contact members) 190*c*, 190*b*, and 190*a* which are electrically connected to the capacitor electrode 175 through the contact hole 83 of the fifth insulating layer 182. Each pixel electrode 191*a*, 191*b*, and 191*c* is electrically connected to the drain region 135*a* of the first transistor T1 via the contact pads 190*c*, 190*b*, and 190*a*, the conductive pattern 183*b*, and the capacitor electrode 175, thereby receiving the voltage from the first transistor T1.

For example, the pixel electrode 191*a* may be connected to the first transistor T1 of the pixel circuit portion PX3, the pixel electrode 191*b* may be connected to the first transistor T1 of the pixel circuit portion PX2, and the pixel electrode 191*c* may be connected to the first transistor T1 of the pixel circuit portion PX1.

In a plan view, a part among the plurality of pixel electrodes 191*a*, 191*b*, and 191*c* may overlap at least a part among the plurality of data lines 171*a*, 171*b*, and 171*c* neighboring each other. For example, as shown in FIG. 2 to FIG. 4, one among the plurality of pixel electrodes 191*a*, 191*b*, and 191*c* may overlap at least a part among the plurality of data lines 171*a*, 171*b*, and 171*c* neighboring each other. Particularly, the exemplary embodiment shown in FIG. 2 to FIG. 4 shows an example that only one pixel electrode 191*c* among the plurality of pixel electrode 191*a*, 191*b*, and 191*c* overlaps at least a part among the plurality of data lines 171*a*, 171*b*, and 171*c* neighboring each other, and the rest of the pixel electrodes 191*a* and 191*b* do not overlap the plurality of data lines 171*a*, 171*b*, and 171*c*.

In detail, as shown in FIG. 3, the pixel electrode 191*c* overlaps the entire width of the first direction DR1 of one data line 171*b* among the plurality of data lines 171*a*, 171*b*, and 171*c* neighboring each other, and may overlap or not overlap a part of the width of each first direction DR1 of the rest of the data lines 171*a* and 171*c*. According to another exemplary embodiment, the pixel electrode 191*c* may overlap each entire width of the first direction DR1 of two data lines among the plurality of data lines 171*a*, 171*b*, and 171*c* neighboring each other, and may overlap or not overlap the part of the width of the first direction DR1 of the remaining data line. According to another exemplary embodiment, the pixel electrode 191*c* may overlap the entire width of the first direction DR1 of the plurality of data lines 171*a*, 171*b*, and 171*c* neighboring each other. According to another exemplary embodiment, the pixel electrode 191*c* overlaps a portion of the width of the first direction DR1 of one of two data lines among the neighboring data lines 171*a*, 171*b*, and 171*c*, and may not overlap the remaining data line.

The pixel electrode 191*c* overlapping at least a portion of the plurality of data lines 171*a*, 171*b*, and 171*c* may have the smallest planar area among the plurality of pixel electrodes 191*a*, 191*b*, and 191*c*.

The pixel electrode layer may comprise a semi-transmissive conductive material or a reflective conductive material.

A sixth insulating layer 350 may be disposed on the fifth insulating layer 182. The sixth insulating layer 350 has openings 355*a*, 355*b*, and 355*c* disposed on the pixel electrodes 191*a*, 191*b*, and 191*c*, respectively.

The sixth insulating layer 350 may include an organic insulating material such as a polyacryl-based resin, a polyimide-based resin, or the like.

An emission layer 370 may be disposed on the sixth insulating layer 350 and the pixel electrode layer. The emission layer 370 may include a part disposed within the openings 355a, 355b, and 355c of the sixth insulating layer 350. The emission layer 370 may include an organic emission material or an inorganic emission material. The emission layer 370 may include a portion disposed above the sixth insulating layer 350 as shown, and the portion over the at least a portion of the sixth insulating layer 350 may not be covered by the emission layer 370.

The sixth insulating layer 350 and the emission layer 370 may include a contact hole 82 disposed on the contact pad (contact member) 190d.

A common electrode 270 is disposed on the emission layer 370. The common electrode 270 may be continuously formed over the plurality of pixel circuit portions PX1, PX2, and PX3. The common electrode 270 may be electrically connected to the common voltage line 170 via the contact pad 190d through the contact hole 82, thereby receiving a common voltage.

The common electrode 270 may include a conductive transparent material.

Each of the pixel electrodes 191a, 191b, and 191c, the emission layer 370, and the common electrode 270 together form the light emitting diode (ED), one of the pixel electrodes 191a, 191b, and 191c, and the common electrode 270 becomes a cathode, and the other becomes an anode. In the previous example, the pixel electrodes 191a, 191b, and 191c are anodes.

In a plan view, the regions where the openings 355a, 355b and 355c of the sixth insulating layer 350 are disposed may define a light emitting region of each pixel.

Referring to FIG. 2 and FIG. 3, the plurality of openings 355a, 355b and 355c respectively corresponding to the plurality of pixel electrodes 191a, 191b and 191c which are respectively connected to the plurality of pixel circuit portions PX1, PX2 and PX3 of one group may be arranged adjacent to one another in the first direction DR1.

According to an exemplary embodiment, in a plan view, the area of the pixel electrode 191a is the largest area and the area of the pixel electrode 191c is the smallest are among the plurality of pixel electrodes 191a, 191b, and 191c. Accordingly, in a plan view, the area of the opening 355a disposed on the pixel electrode 191a is largest and the area of the opening 355c disposed on the pixel electrode 191c is smallest among a plurality of openings 355a, 355b, and 355c. In this case, a light emitting region corresponding to the pixel electrode 191a may represent red, a light emitting region corresponding to the pixel electrode 191b may represent green, and a light emitting region corresponding to the pixel electrode 191c may represent blue.

As the lower patterns 111 are electrically connected to the pixel electrodes 191a, 191b and 191c via the capacitor electrodes 175 and also overlap the channel region 134a of the first transistor T1, a current variation in a saturation region of a voltage-current characteristic of the first transistor T1 is reduced so that a region where the first transistor T1 has a constant output may be widened. Therefore, even if there is a change in the source-drain voltage Vds of the first transistor T1, the output current of the first transistor T1 is kept constant, thereby improving the output saturation characteristic. Thus, the luminance deviation between the pixels due to a deviation of the output current of the first transistor T1 is reduced, thereby improving the image quality.

According to an exemplary embodiment of the present inventive concept, as shown in FIG. 2 and FIG. 3, the plurality of pixel electrodes 191a, 191b and 191c respectively corresponding to the plurality of pixel circuit portions PX1, PX2 and PX3 of one group which are arranged in the second direction DR2 and the plurality of openings 355a, 355b, and 355c corresponding thereto, that is, the plurality of light emitting diodes (LED), may be arranged along the first direction DR1. Accordingly, even in a display device of high resolution, efficiency of the pixel arrangement (referred to as a layout) may be increased.

As the display device has high resolution, the area of the pixel electrodes 191a, 191b and 191c is reduced. Thus, the capacitance of the storage capacitor is reduced. Reduce in capacitance may cause a fluctuation in the voltages of the pixel electrodes 191a, 191b and 191c and thus the deviation in the driving current of the light emitting diode (LED) ED is likely to occur. Particularly, like the present exemplary embodiment, when only the part among the plurality of pixel electrodes 191a, 191b and 191c overlaps the plurality of data lines 171a, 171b, and 171c, the voltage of the pixel electrodes overlapping the data lines 171a, 171b, and 171c is more likely to be fluctuated due to the parasitic capacitors formed between the data lines 171a, 171b and 171c and the pixel electrodes 191a, 191b and 191c, and crosstalk caused by the parasitic capacitor.

However, according to the present exemplary embodiment, because the pixel electrode 191c having the smallest area among the plurality of pixel electrodes 191a, 191b and 191c overlaps the data lines 171a, 171b, and 171c, the parasitic capacitance and the crosstalk with the data line 171a, 171b, and 171c may be minimized. When the light emission region corresponding to the pixel electrode 191c represents blue, since blue pixel has the lowest visibility, the parasitic capacitors between the pixel electrode 191c and the data lines 171a, 171b and 171c, and resulting crosstalk may be minimized, thereby reducing the display failure.

In the present exemplary embodiment, the data line 171b having the largest overlapping area with the pixel electrode 191c may provide the data voltage to the pixel circuit portion PX2 connected to the pixel electrode 191c, but the data line having the largest overlapping area with the pixel electrode is not limited thereto.

Next, the display device according to an exemplary embodiment of the present inventive concept is described with reference to FIG. 5 and FIG. 6 as well as the above-described drawings. The differences from the previous exemplary embodiments are focused on and the same reference numerals are used for the corresponding constituent elements.

Figure 5:
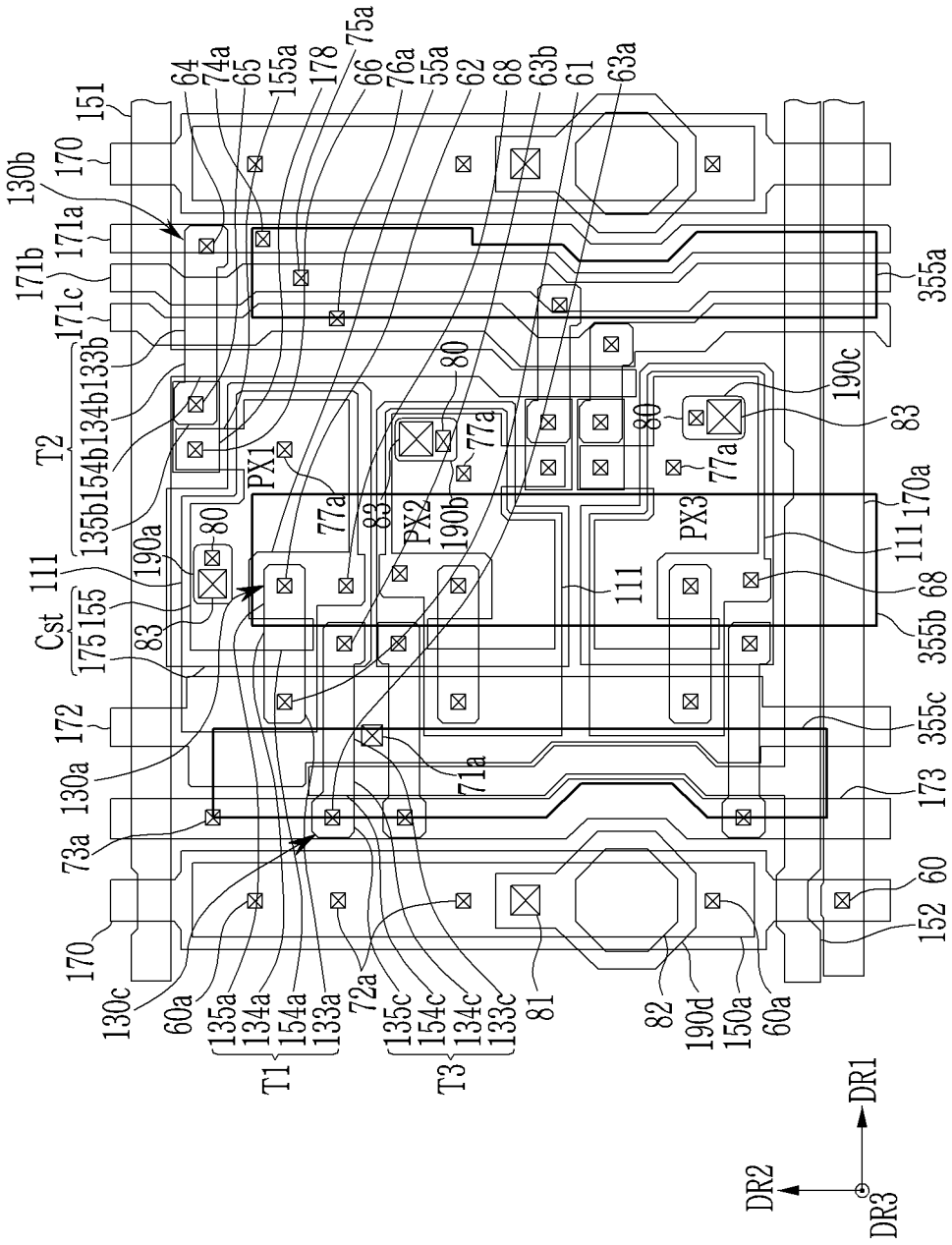
FIG. 5 is a plan layout view of a plurality of pixels of a display device according to an exemplary embodiment of the present inventive concept.
Figure 6:
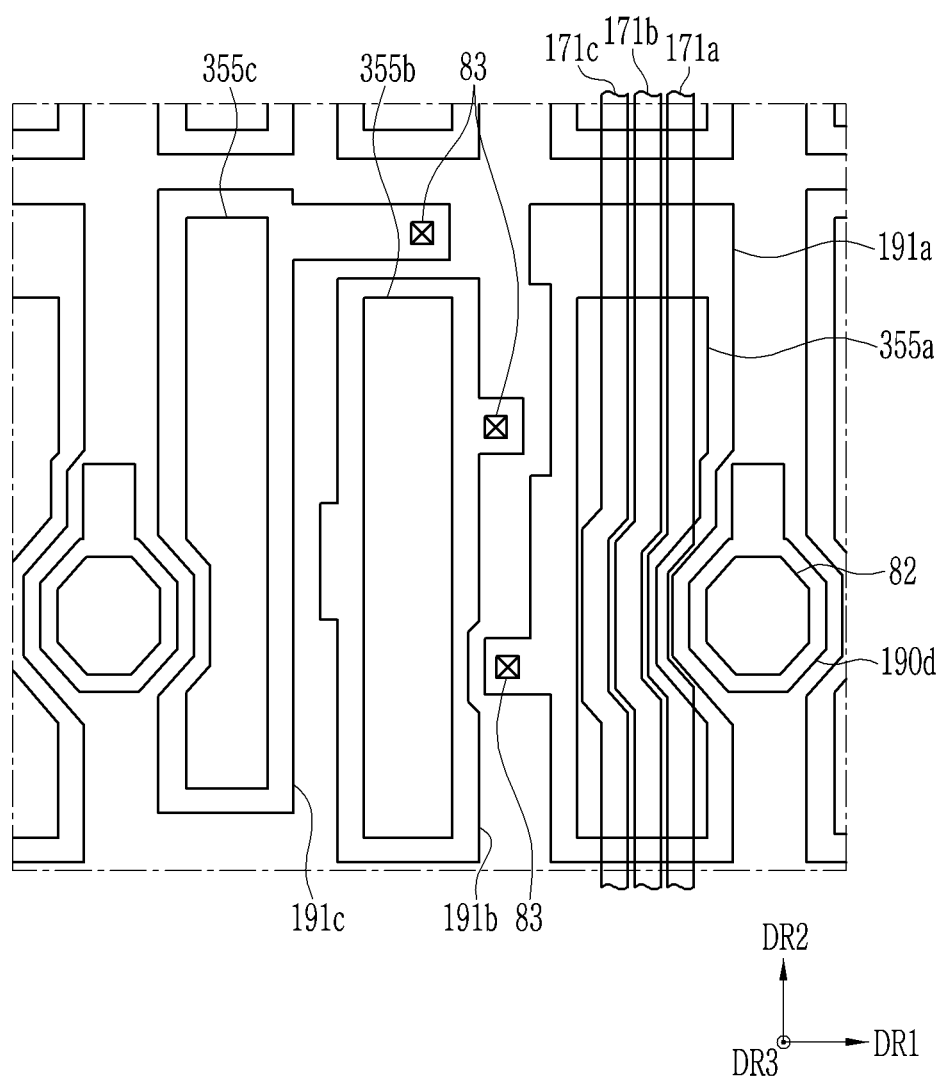
FIG. 6 is a plan layout view of a pixel electrode layer and a plurality of data lines of a display device according to an exemplary embodiment of the present inventive concept.

FIG. 5 is a plan layout view of a plurality of pixels of a display device according to an exemplary embodiment of the present inventive concept, and FIG. 6 is a plan layout view of a pixel electrode layer and a plurality of data lines of a display device according to an exemplary embodiment of the present inventive concept.

Referring to FIG. 5 and FIG. 6, the display device according to the present exemplary embodiment is the same as most of the above-described exemplary embodiment except for the arrangement of the pixel electrodes 191a, 191b, and 191c and the arrangement of the openings 355a, 355b, and 355c. Specifically, the pixel electrode 191c (the blue pixel electrode) may be disposed at the left side of the pixel electrode 191b (the green pixel electrode), and the pixel electrode 191a (the red pixel electrode) may be disposed at the right side of the pixel electrode 191b.

The present exemplary embodiment is an example in which only one pixel electrode 191a (the red pixel electrode) of a plurality of pixel electrodes 191a, 191b and 191c overlaps at least a part of the plurality of data lines 171a, 171b and 171c neighboring each other. In detail, as shown in FIG. 5 and FIG. 6, only one pixel electrode 191a among the plurality of pixel electrodes 191a, 191b and 191c may overlap the entire width along the first direction DR1 of the plurality of data lines 171a, 171b, and 171c neighboring each other, and the remaining pixel electrodes 191b and 191c may not overlap the plurality of data lines 171a, 171b and 171c.

According to another exemplary embodiment, the pixel electrode 191a may overlap at least a part of the plurality of neighboring data lines 171a, 171b and 171c. The pixel electrode 191a may overlap at least a part of the width along the first direction DR1 of the plurality of neighboring data lines 171a, 171b and 171c.

The pixel electrode 191a overlapping at least a part of the plurality of data lines 171a, 171b and 171c may have the largest area among the plurality of pixel electrode 191a, 191b and 191c in a plan view.

According to the present exemplary embodiment, because the pixel electrode 191a having the largest area among the plurality of pixel electrodes 191a, 191b and 191c overlaps the data lines 171a, 171b and 171c, the effect due to the parasitic capacitor and the resulting crosstalk with the data lines 171a, 171b, and 171c may be minimized. That is, for the pixel electrode 191a having the largest area among the plurality of pixel electrodes 191a, 191b and 191c, because the capacitance of the storage capacitor capable of maintaining the voltage between the gate electrode G1 of the first transistor T1 and the drain electrode D1 of the first transistor T1 is relatively large, the fluctuations in the voltage due to the parasitic capacitors between the pixel electrode 191a and the data lines 171a, 171b, and 171c may be relatively small.

Next, the display device according to an exemplary embodiment of the present inventive concept is described with reference to FIG. 7 and FIG. 8 as well as the above-described drawings.

Figure 7:
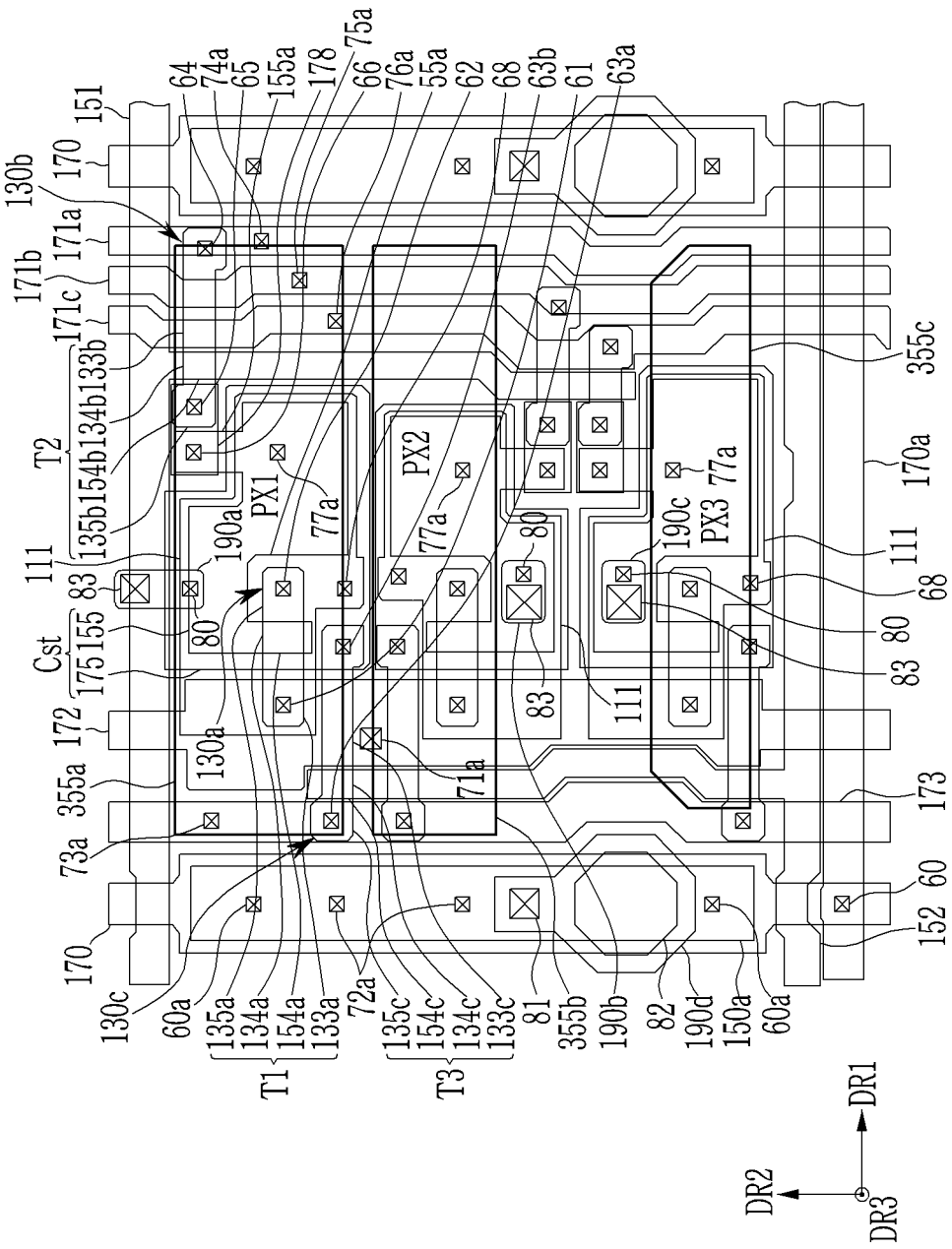
FIG. 7 is a plan layout view of a plurality of pixels of a display device according to an exemplary embodiment of the present inventive concept.
Figure 8:
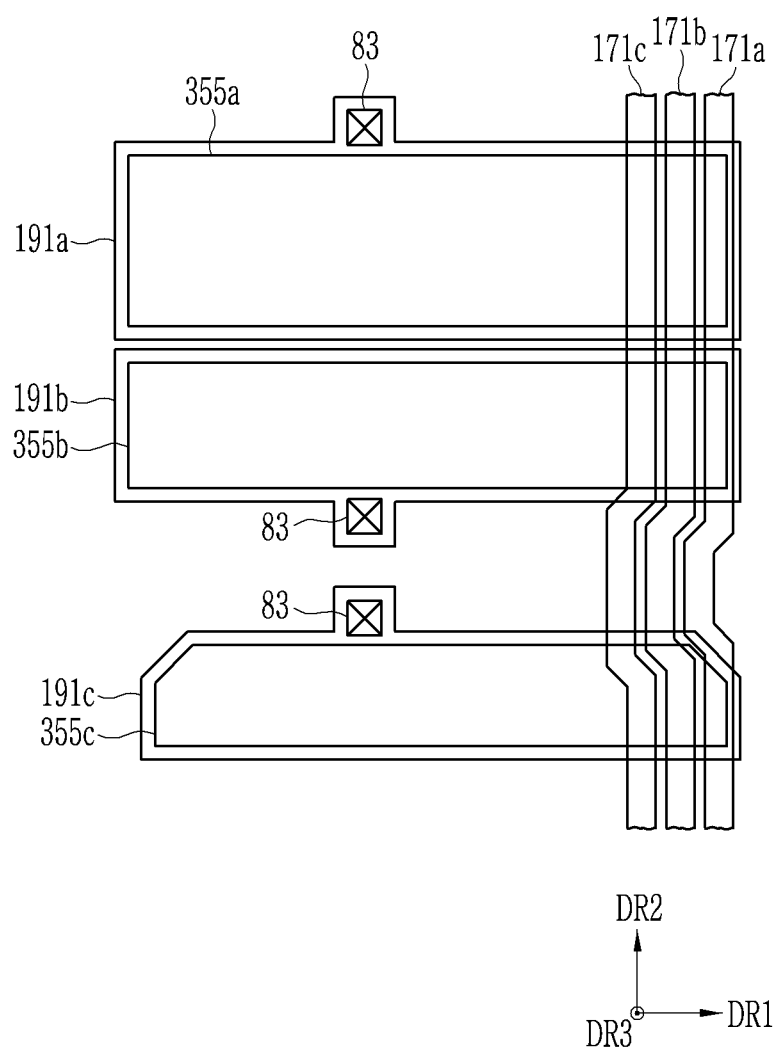
FIG. 8 is a plan layout view of a pixel electrode layer and a plurality of data lines of a display device according to an exemplary embodiment of the present inventive concept.

FIG. 7 is a plan layout view of a plurality of pixels of a display device according to an exemplary embodiment of the present inventive concept, and FIG. 8 is a plan layout view of a pixel electrode layer and a plurality of data lines of a display device according to an exemplary embodiment of the present inventive concept.

Referring to FIG. 7 and FIG. 8, the display device according to the present exemplary embodiment is the same as most of the above-described exemplary embodiment except for the arrangement of the pixel electrodes 191a, 191b and 191c, and the arrangement of the openings 355a, 355b and 355c. Specifically, the plurality of pixel electrodes 191a, 191b and 191c may be arranged along the second direction DR2, and the plurality of openings 355a, 355b, and 355c may be arranged along the second direction DR2.

The pixel electrode 191a may be connected to the first transistor T1 of the pixel circuit portion PX1, the pixel electrode 191b may be connected to the first transistor T1 of the pixel circuit portion PX2, and the pixel electrode 191c may be connected to the first transistor T1 of the pixel circuit portion PX3, but the connection is not limited thereto. That is, the arrangement order of the plurality of pixel electrodes 191a, 191b, and 191c may be altered.

According to the present exemplary embodiment, all of the plurality of pixel electrodes 191a, 191b and 191c of one group may overlap at least a portion of the plurality of data lines 171a, 171b, and 171c. Specifically, as shown in FIG. 7 and FIG. 8, all of the plurality of pixel electrodes 191a, 191b and 191c may overlap the entire width of the plurality of neighboring data lines 171a, 171b and 171c along the first direction DR1. The widths of the data lines 171a, 171b and 171c along the first direction DR1 in which the plurality of pixel electrodes 191a, 191b and 191c overlap with the data lines 171a, 171b and 171c may be substantially the same.

According to the present exemplary embodiment, since the plurality of pixel electrodes 191a, 191b and 191c equally overlap the data lines 171a, 171b, and 171c, all of the plurality of pixel electrodes 191a, 191b and 191c may form the parasitic capacitor with the data lines 171a, 171b and 171c. The plurality of pixel electrodes 191a, 191b and 191c may be affected by the parasitic capacitor at the same time. Therefore, it is possible to reduce the deviation between image qualities of the light emitting regions of the plurality of pixels. In other words, the deviation of the parasitic capacitors and the crosstalk between the plurality of pixel electrodes 191a, 191b and 191c and the data lines 171a, 171b and 171c may be minimized, thus the display quality may be improved.

Next, the display device according to an exemplary embodiment of the present inventive concept is described with reference to FIG. 9 as well as the above-described drawings.

Figure 9:
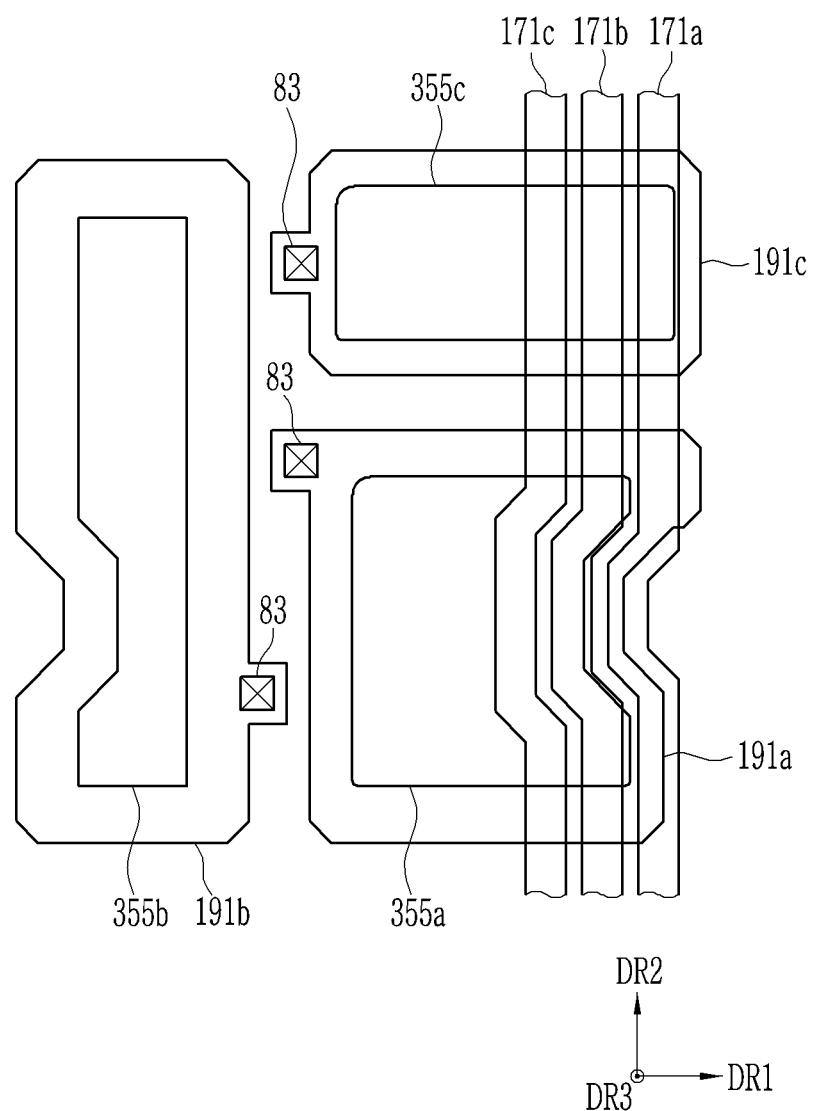
FIG. 9 is a plan layout view of a pixel electrode layer and a plurality of data lines of a display device according to an exemplary embodiment of the present inventive concept.

FIG. 9 is a plan layout view of a pixel electrode layer and a plurality of data lines of a display device according to an exemplary embodiment of the present inventive concept.

Referring to FIG. 9, the display device according to the present exemplary embodiment is the same as most of the above-described exemplary embodiment, but the arrangement of the pixel electrodes 191a, 191b and 191c, and the arrangement of the openings 355a, 355b and 355c may be different. Specifically, two pixel electrodes 191a and 191c among the plurality of pixel electrodes 191a, 191b and 191c are arranged along the second direction DR2, and the other pixel electrode 191b is arranged adjacent to the first direction DR1 at one side of the two pixel electrodes 191a and 191c. The openings 355a and 355c corresponding to two pixel electrodes 191a and 191c are arranged along the second direction DR2, and the opening 355b corresponding to one pixel electrode 191b is arranged at one side of the two openings 355a and 355c along the first direction DR1.

The configurations of pixel circuits in which each of the pixel electrodes 191a, 191b and 191c are electrically connected are the same as the exemplary embodiment shown in FIG. 7 such that the same explanations and drawings are omitted. For example, the pixel electrode 191a is connected to the first transistor T1 of the pixel circuit portion PX1 described above, the pixel electrode 191b is connected to the first transistor T1 of the pixel circuit portion PX2 described above, and the pixel electrode 191c is connected to the first transistor T1 of the pixel circuit portion PX3 described above, but the connection relationship is not limited thereto.

According to the present exemplary embodiment, two pixel electrodes 191a and 191c among the plurality of pixel electrodes 191a, 191b and 191c of one group may overlap at least a part of the plurality of data lines 171a, 171b and 171c, and one remaining pixel electrode 191b may not overlap the data lines 171a, 171b and 171c. The light emission region corresponding to the pixel electrode 191a may represent red, the light emission region corresponding to the pixel electrode 191b may represent green, and the light emission region corresponding to the pixel electrode 191c may represent blue.

Alternatively, the right and left positions of the two pixel electrodes 191a and 191c and the one pixel electrode 191b shown in FIG. 9 may be altered. In this case, the pixel electrode 191b among the plurality of pixel electrodes 191a, 191b and 191c of one group may overlap at least a portion of the plurality of data lines 171a, 171b and 171c, and the pixel electrodes 191a and 191c may not overlap the data lines 171a, 171b and 171c.

Next, an example of a cross-sectional structure of the display device according to an exemplary embodiment of the present inventive concept is described with reference to FIG. 10 as well as the above-described drawings.

Figure 10:
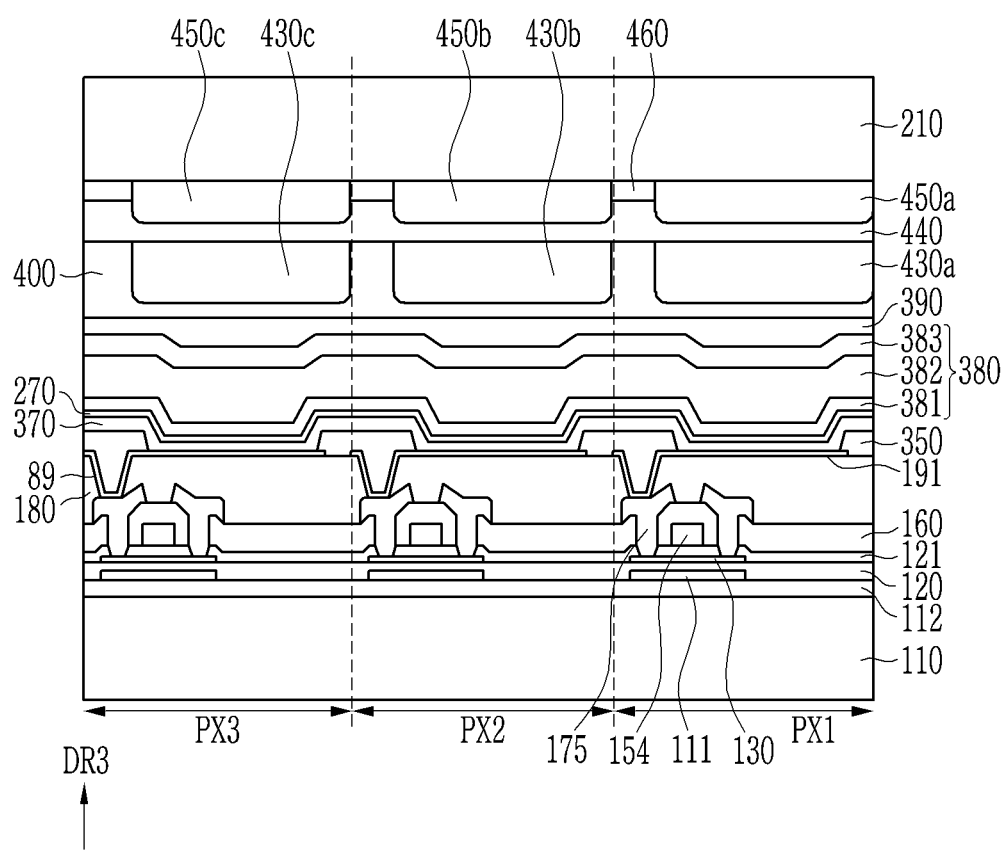
FIG. 10 is a cross-sectional view of a display device according to an exemplary embodiment of the present inventive concept.

FIG. 10 shows the cross-sectional structure of the plurality of pixel circuit portions PX1, PX2 and PX3 as described above, and the same description for the same elements as the cross-sectional structure shown in FIG. 4 described above is omitted.

A barrier layer 112 containing the insulating material may be disposed on the substrate 110, and the first conductive layer containing the lower pattern 111 may be disposed thereon.

The buffer layer 120 may be disposed on the first conductive layer, and an active layer 130 may be disposed on the buffer layer 120.

A first insulating layer 121 may be disposed on the active layer 130. The first insulating layer 121 may be the same layer as the insulating pattern 144 described above, however it may be formed on the entire area on the substrate 110 unlike the insulating pattern 144. A plurality of contact holes may be formed in the first insulating layer 121. That is, the first insulating layer 121 may also be disposed on the buffer layer 120 unlike the insulating pattern 144. Alternatively, the first insulating layer 121 may have the same configuration as the insulating pattern 144.

The second conductive layer including a gate electrode 154 may be disposed on the first insulating layer 121 and the second insulating layer 160 may be disposed thereon.

The third conductive layer including the capacitor electrode 175 may be disposed on the second insulating layer 160 and the third insulating layer 180 may be disposed thereon.

The pixel electrode layer including a plurality of pixel electrodes 191 may be disposed on the third insulating layer 180. The pixel electrode 191 may be electrically connected to the capacitor electrode 175 through a contact hole 89 of the third insulating layer 180.

The sixth insulating layer 350 may be disposed on the third insulating layer 180. The emission layer 370 and the common electrode 270 may be sequentially disposed on the pixel electrode layer and the sixth insulating layer 350. The emission layer 370 may include a luminescent material that emits a first color light that may be blue light.

An encapsulation layer 380 including a plurality of insulating layers 381, 382, and 383 may be disposed on the common electrode 270. The insulating layer 381 and the insulating layer 383 may include an inorganic insulating material, and the insulating layer 382 disposed between the insulating layer 381 and the insulating layer 383 may include an organic insulating material.

A filling layer 390 containing a filler may be disposed on the encapsulation layer 380. A cover layer 400 including an insulating material and a plurality of color conversion layers 430a and 430b and a transmissive layer 430c may be disposed on the filling layer 390.

The transmissive layer 430c may transmit incident light. That is, the transmissive layer 430c may transmit the first color light that may be blue light. The transmissive layer 430c may include a polymer material that transmits the first color light. The region in which the transmissive layer 430c is disposed may correspond to the blue light emission region. The transmissive layer 430c may pass the incident first color light as it is without changing the color of light. The transmissive layer 430c may not include semiconductor nanocrystals which alter a wavelength of incident light.

The color conversion layers 430a and 430b may include different semiconductor nanocrystals each other. For example, the first color light incident on the color conversion layer 430a may be converted to the second color light by the semiconductor nanocrystal included in the color conversion layer 430b. The first color light incident on the color conversion layer 430b may be converted to the third color light by the semiconductor nanocrystal included in the color conversion layer 430b.

The semiconductor nanocrystal may include at least one of a phosphor or a quantum dot material that converts the incident first color light into the second color light or the third color light.

A core of the quantum dot may be selected from a Group II-VI compound, a Group III-V compound, a Group IV-VI compound, a Group IV element, another Group IV compound, and a combination thereof.

The Group II-VI compound may be selected from the group consisting of a binary compound selected from the group consisting of CdSe, CdTe, ZnS, ZnSe, ZnTe, ZnO, HgS, HgSe, HgTe, MgSe, MgS, and a mixture thereof; a tertiary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

The Group III-V compound may be selected from the group consisting of a binary compound selected from the group consisting of GaN, GaP, GaAs, GaSb, AN, AlP, AlAs, AlSb, InN, InP, InAs, InSb, and a mixture thereof; a tertiary compound selected from the group consisting of GaNP, GaNAs, GaNSb, GaPAs, GaPSb, AlNP, AlNAs, AlNSb, AlPAs, AlPSb, InNP, InNAs, InNSb, InPAs, InPSb, GaAlNP, and a mixture thereof; and a quaternary compound selected from the group consisting of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof.

The Group IV-VI compound may be selected from the group consisting of a binary compound selected from the group consisting of SnS, SnSe, SnTe, PbS, PbSe, PbTe, and a mixture thereof; a tertiary compound selected from the group consisting of SnSeS, SnSeTe, SnSTe, PbSeS, PbSeTe, PbSTe, SnPbS, SnPbSe, SnPbTe, and a mixture thereof; and a quaternary compound selected from the group consisting of SnPbSSe, SnPbSeTe, SnPbSTe, and a mixture thereof. The Group IV element may be selected from the group consisting of Si, Ge, and a mixture thereof. The Group IV compound may be a binary compound selected from the group consisting of SiC, SiGe, and a mixture thereof.

In this case, the binary compound, the tertiary compound, or the quaternary compound may exist in particles at a uniform concentration, or may exist in the same particle divided into states where concentration distributions are partially different. Further, the color conversion media layer may have a core/shell structure where one quantum dot surrounds another quantum dot. An interface between the core and the shell may have a concentration gradient, such that a concentration of an element existing in the shell is gradually reduced toward the center thereof.

In some exemplary embodiments, the quantum dot may have a core-shell structure including the core including the nanocrystal described above and a shell surrounding the core. The shell of the quantum dot serves as a protective layer to prevent chemical denaturation of the core and/or to serve as a charging layer to impart electrophoretic characteristics to the quantum dot. The shell may be a single layer or a multiple layer. The interface between the core and the shell may have a concentration gradient in which the concentration of the elements existing in the shell decreases toward the center. Examples of the shells of the quantum dot include metal or nonmetal oxides, semiconductor compounds, or combinations thereof.

For example, the metal or nonmetal oxide may be a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and NiO, or a tertiary compound such as $MgAl_2O_4$, $CoFe_2O_4$, $NiFe_2O_4$, and $CoMn_2O_4$, but the present inventive concept is not limited thereto.

Also, the semiconductor compound may be CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, or AlSb, however the present inventive concept is not limited thereto.

The quantum dot may have a full width at half maximum (FWHM) of an emission wavelength spectrum of about 45 nm or less, preferably about 40 nm or less, and more preferably about 30 nm or less, and in this range, color purity or color reproducibility may be improved. Also, since the light emitted by the quantum dot is emitted in all directions, the light viewing angle may be improved.

Further, a form of the quantum dot is a form generally used in the art and is not particularly limited, but more specifically, forms such as spherical, pyramidal, multi-arm-shaped, or cubic nanoparticles, nanotubes, nanowires, nanofibers, and nanoplate-shaped particles may be used.

The quantum dot may adjust the color of emitted light depending on the particle size, so the quantum dot can have various luminescent colors such as blue, red, and green.

An insulating layer 440 may be disposed on the plurality of color conversion layers 430a and 430b and the transmissive layer 430c. A plurality of color filters 450a, 450b and 450c, and a light blocking member 460 may be disposed on the insulating layer 440.

The color filter 450a may represent the second color light, the color filter 450b may represent the third color light, and the color filter 450c may represent the first color light.

The light blocking member 460 may be disposed between the neighboring color filters 450a, 450b and 450c.

A substrate 210 may be disposed on the plurality of color filters 450a, 450b and 450c, and the light blocking member 460. That is, the plurality of the color conversion layers 430a and 430b and the plurality of color filters 450a, 450b and 450c may be disposed between the substrate 110 and the substrate 210.

According to another exemplary embodiment of the present invention, when the emission layer 370 includes the quantum dot, the plurality of color conversion layers 430a and 430b and the transmissive layer 430c may be omitted.

In the present description, the constituent elements disposed in the same conductive layer may include the same material as each other, and the constituent elements disposed in the same insulating layer may include the same material as each other.

While this inventive concept has been described in connection with what is presently considered to be practical exemplary embodiments, it is to be understood that the inventive concept is not limited to the disclosed embodiments. On the contrary, it is intended to cover various modifications and equivalent arrangements included within the spirit and scope of the appended claims.

What is claimed is:

1. A display device comprising:
   a first pixel circuit portion including at least one transistor;
   a second pixel circuit portion including at least one transistor;
   a first pixel electrode electrically connected to the first pixel circuit portion;
   a second pixel electrode electrically connected to the second pixel circuit portion;
   a first data line electrically connected to the first pixel circuit portion; and
   a second data line electrically connected to the second pixel circuit portion,
   wherein the first data line and the second data line are arranged adjacent to each other along a first direction,
   wherein the second pixel circuit portion overlaps the first data line and the second data line in a plan view, and
   wherein the first pixel circuit portion and the second pixel circuit portion are arranged along a second direction perpendicular to the first direction.

2. The display device of claim 1, wherein the first pixel electrode and the second pixel electrode are arranged along the first direction.

3. The display device of claim 1, wherein the first pixel electrode and the second pixel electrode are arranged along the second direction.

4. The display device of claim 1, wherein the second pixel electrode overlaps at least a part of the first data line and the second data line, and the first pixel electrode does not overlap the first data line and the second data line.

5. The display device of claim 1, further comprising
   a first capacitor electrode in the first pixel circuit portion and a second capacitor electrode in the second pixel circuit portion disposed in a same conductive layer as the first data line and the second data line,
   wherein the first pixel electrode is electrically connected to the first transistor via the first capacitor electrode,
   wherein the second pixel electrode is electrically connected to the second transistor via the second capacitor electrode, and
   wherein the first data line and the second data line are disposed at a same side of the first capacitor and the second capacitor.

6. The display device of claim 1, further comprising:
   a third pixel circuit portion including at least one transistor; and
   a third pixel electrode electrically connected to the third pixel circuit portion,
   wherein, in a plan view, the third pixel circuit portion is arranged along the second direction with the first pixel circuit portion and the second pixel circuit portion, and the third pixel electrode is arranged along the first direction with the first pixel electrode and the second pixel electrode.

7. The display device of claim 6, wherein the second pixel electrode overlaps at least a part of the first data line and the second data line and has a smallest area among the first pixel electrode, the second pixel electrode, and the third pixel electrode.

8. The display device of claim 7, wherein the second pixel electrode is a blue pixel electrode.

9. The display device of claim 6, wherein the second pixel electrode has a largest area among the first pixel electrode, the second pixel electrode and third pixel electrode.

10. The display device of claim 9, wherein the second pixel electrode is a red pixel electrode.

11. The display device of claim 9, wherein the second pixel electrode overlaps with the first data line, the second data line and third data line.

12. A display device comprising:
- a plurality of pixel circuit portions arranged along a first direction;
- a plurality of data lines arranged along a second direction different from the first direction and adjacent to each other;
- a plurality of pixel electrodes electrically connected to the plurality of pixel circuit portions, respectively;
- an emission layer disposed on the plurality of pixel electrodes; and
- a common electrode disposed on the emission layer, wherein the plurality of data lines are disposed at one side of the plurality of pixel circuit portions, wherein at least one pixel electrode among the plurality of pixel electrodes overlaps at least one data line among the plurality of data lines in a plan view, wherein the plurality of pixel electrodes are arranged along the second direction, and wherein the at least one pixel electrode overlaps the plurality of data lines in a plan view.

13. The display device of claim 12, wherein the at least one pixel electrode completely overlaps the plurality of data lines in a plan view.

* * * * *